(12) United States Patent
Harrison et al.

(10) Patent No.: US 7,705,689 B2
(45) Date of Patent: Apr. 27, 2010

(54) SYNCHRONOUSLY STACKABLE DOUBLE-EDGE MODULATED PULSE WIDTH MODULATION GENERATORS

(75) Inventors: William Todd Harrison, Apex, NC (US); Xuening Li, Cary, NC (US); Stefan Wlodzimierz Wiktor, Raleigh, NC (US)

(73) Assignee: Texas Instruments Incorporated, Dallas, TX (US)

( * ) Notice: Subject to any disclaimer, the term of this patent is extended or adjusted under 35 U.S.C. 154(b) by 151 days.

(21) Appl. No.: 12/123,251

(22) Filed: May 19, 2008

(65) Prior Publication Data

US 2009/0284322 A1 Nov. 19, 2009

(51) Int. Cl.
*H03K 7/08* (2006.01)

(52) U.S. Cl. .................................. 332/109; 332/110

(58) Field of Classification Search .......... 332/109–111
See application file for complete search history.

(56) References Cited

U.S. PATENT DOCUMENTS

| 7,332,898 | B1 | 2/2008 | Harrison et al. |
| 7,515,072 | B2 * | 4/2009 | Borisavljevic ............... 341/53 |

\* cited by examiner

*Primary Examiner*—David Mis
(74) *Attorney, Agent, or Firm*—John J. Patti; Wade J. Brady, III; Frederick J. Telecky, Jr.

(57) ABSTRACT

Synchronously stackable double-edge modulated pulse width modulation generators are disclosed. An example pulse width modulation generator includes a ramp generator to generate first and second ramp signals that interact to form a virtual ramp signal; and a comparator module coupled to the ramp generator configured to produce a pulse width modulated signal based on a comparison between the virtual ramp signal and an input signal.

23 Claims, 5 Drawing Sheets

SYNCHRONOUSLY STACKABLE DOUBLE-EDGE MODULATED PULSE WIDTH MODULATION GENERATORS

FIELD OF THE DISCLOSURE

This disclosure relates generally to pulse width modulation devices and, more particularly, to synchronously stackable double-edge modulated pulse width modulation generators.

BACKGROUND

Pulse width modulation (PWM) typically involves comparing an input signal to a single oscillating signal (ramp). This comparison results in an output signal that is a logical high when the input signal exceeds the ramp and a logical low when the ramp exceeds the input signal. The width of the output pulses vary in proportion to the level of the input signal. That is, when the input signal has a high value, it exceeds the ramp signal more frequently and, consequently, the output signal has a high duty cycle. Thus, PWM is commonly used to vary the width of pulses in a periodic signal or power source to control the duty cycle of the periodic signal or power source. However, conventional PWM systems are susceptible to noise and include limitations on a minimum/maximum controllable duty cycle due, in part, to nonlinearities caused by changing the slope of the single ramp signal. In some systems, PWM devices are combined or paralleled. However, the resulting propagation delay caused by offsets and delays of the combined comparators reduces predictability and repeatability between the PWM devices.

SUMMARY OF THE INVENTION

Described herein are example pulse width modulation generators and example methods for use in pulse width modulation systems. The example pulse width modulation generators are synchronously stackable. An example pulse width modulation generator includes a ramp generator to generate first and second ramp signals that interact to form a virtual ramp signal. Further, the example pulse width modulation generator includes a comparator module coupled to the ramp generator configured to produce a pulse width modulated signal based on a comparison between the virtual ramp signal and an input signal. In some examples, the pulse width modulation generator further comprises a synchronization interface to enable a communication with one or more other pulse width modulation generators.

DETAILED DESCRIPTION

The example methods and apparatus described herein involve pulse width modulation (PWM) of data signals and/or power sources. Generally stated, the example implementations described in greater detail below enable a stacking or paralleling of multiple integrated circuits (ICs) that employ techniques and components to improve the noise immunity, ease of design, and repeatability of PWM control topologies (e.g., for use in a DC/DC converter). For example, as described herein, PWM generators utilize two ramp signals, one rising and one falling, that interact to create a "virtual" triangular oscillating ramp. Specifically, the two ramp signals (e.g., as controlled by the logic signals described herein) continue to charge/discharge beyond a switching point (e.g., as defined by a periodicity of the system), thereby allowing a larger comparator overdrive at very high or low duty cycles. As illustrated herein, the interaction between the two ramp signals enables a full duty cycle range (e.g., 0% to 100%) to be realized. Moreover, dual comparators are configured to cancel out certain delays and offsets that create propagation delays, thereby improving the repeatability between stacked or paralleled ICs.

Figure 1:
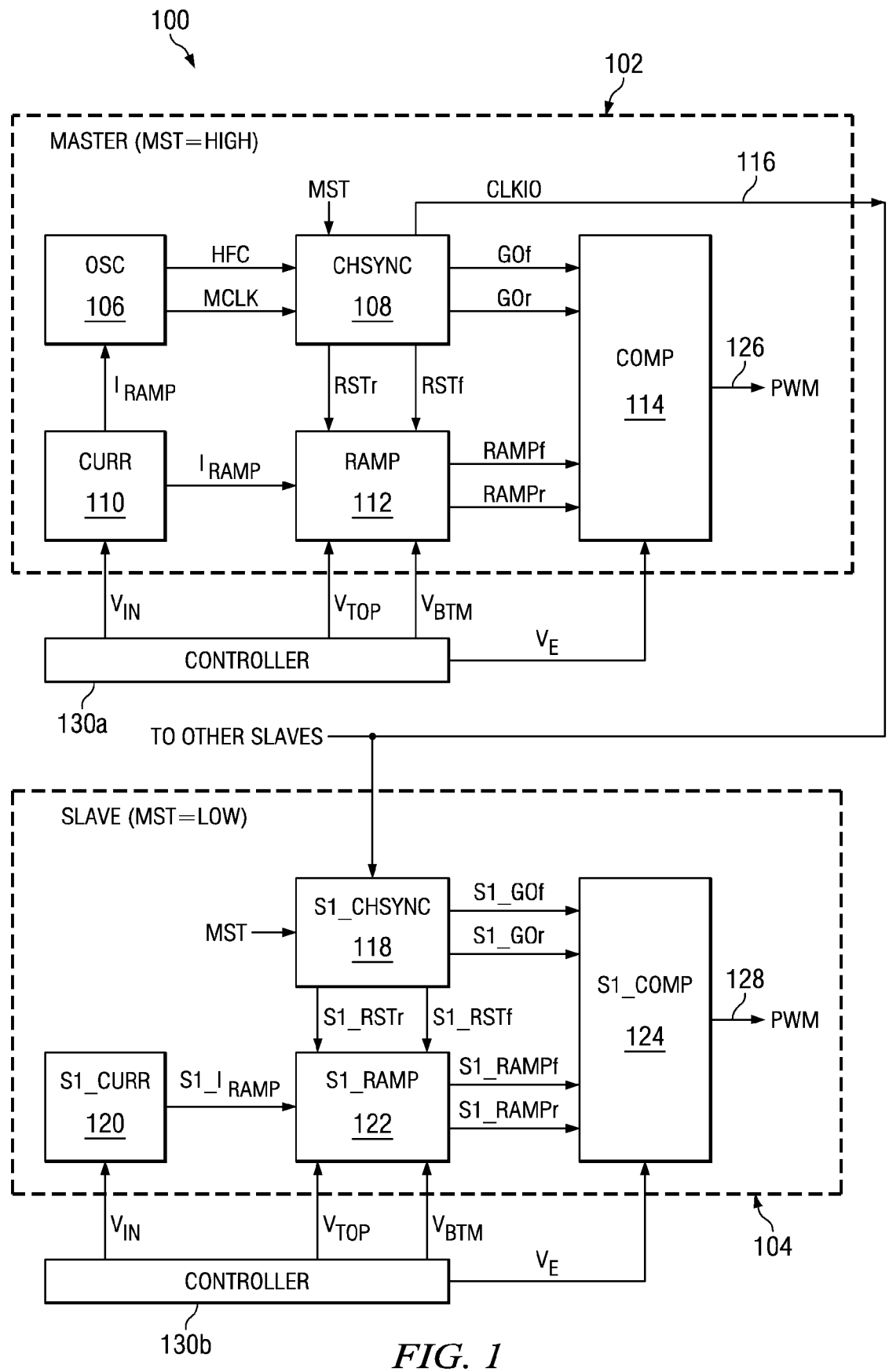
FIG. 1 is a block diagram of an example pulse width modulation (PWM) system including an example master PWM generator and an example slave PWM generator.

FIG. 1 is a block diagram of an example PWM system 100 including an example master PWM generator 102 and an example slave PWM generator 104. In the illustrated example, the master PWM generator 102 includes an oscillator 106, a channel synchronizer 108, a current generator 110, a ramp generator 112, and a comparator module 114. The master PWM generator 102 is in communication with the slave PWM generator 104 via a synchronization interface 116.

The slave PWM generator 104 includes a channel synchronizer 118, a current generator 120, a ramp generator 122, and a comparator module 124. The timing of the slave PWM generator 104 is controlled by the master PWM generator 102. Thus, the slave PWM generator 104 does not include an oscillator in the example shown in FIG. 1. Of course, the slave PWM generator 104 may include an oscillator in other examples.

As described herein, the master PWM generator 102 is configured to produce a first PWM signal 126 and the slave PWM generator 104 is configured to produce a second PWM signal 128. While the example PWM system 100 of FIG. 1 shows the master PWM generator 102 in communication with one slave PWM generator 104, the master PWM generator 102 may be synchronized and/or stacked with any number of additional slave devices (e.g., five additional slave PWM generators operating in a substantially similar manner as the example slave PWM generator 104 of FIG. 1). For example, as illustrated in FIG. 1, the synchronization interface 116 may be conveyed to and shared by additional slave PWM devices. Further, the example PWM system 100 of FIG. 1 includes a designation signal MST to indicate which PWM generator is the master device and which PWM generators are slaves. Accordingly, in the illustrated example of FIG. 1, the designation signal MST in the master PWM generator 102 is set to a logic high and the designation signal MST in the slave PWM generator 104 is set to a logic low.

In the illustrated example of FIG. 1, the PWM system 100 includes a first controller 130a and a second controller 130b configured to supply the master PWM generator 102 and the slave PWM generator 104, respectively, a plurality of signals.

Specifically, the first controller 130a supplies an input voltage $V_{IN}$ to the current generator 110, boundary voltages $V_{TOP}$ and $V_{BTM}$ to the ramp generator 112, and an error signal $V_E$ to the comparator module 114. The second controller 130b supplies similar voltages to the corresponding components of the slave PWM generator 104. In other example implementations, a single controller may supply the signals described above to the master PWM generator 102 and any slave devices, such as the slave PWM generator 104. In other example implementations, the signals described above may be received from one or more other external sources.

To define a period $T_S$ (e.g., a switching period) and any other timing characteristics of the PWM system 100, such as periodicity, the oscillator 106 creates a high frequency clock HFC and a main clock MCLK. Edges of the MCLK define the period $T_S$ (e.g., a rising edge corresponding to a start of the period, a falling edge corresponding to a middle of the period, and another rising edge corresponding to an end of the period) and the HFC provides enough divisions within the period $T_S$ for the desired number of time slots NTS. For example, in a system with eight (8) time slots (e.g., NTS=8), the oscillator 106 will create sixteen (16) HFC pulses per PWM period $T_S$. The high frequency clock HFC and the main clock MCLK are conveyed to the channel synchronizer 108. To synchronize the master PWM generator 102 and the slave PWM generator 104 (and any additional slave devices coupled thereto), the channel synchronizer 108 uses the high frequency clock HFC and the main clock MCLK to construct a synchronization signal CLKIO.

The synchronization signal CLKIO is transmitted to the channel synchronizer 118 of the slave PWM generator 104 via the synchronization interface 116. Generally, the synchronization signal CLKIO includes a time signature that can be interpreted by the channel synchronizer 118 (and any other synchronization components of additional slave devices) to align the operation of the slave PWM generator 104 with the operation of the master PWM generator 102. The time signature is a cyclically recurring parameter that functions to communicate the periodicity of the signals of the master PWM generator 102 to the slave PWM generator 104 and, more specifically, the channel synchronizer 118.

Specifically, in the illustrated example of FIG. 1, the synchronization signal CLKIO includes information to set a synchronization frequency and a frequency of the PWM signals 126 and 128 that are to be generated by the PWM system 100. While the master PWM generator 102 knows the desired number of time slots NTS, in the illustrated example, the slave PWM generator 104 does not need to know the desired number of time slots NTS. The example slave PWM generator 104 of FIG. 1 only needs to know on which time slot to begin its own period based on the periodicity communicated by the master PWM generator 102 in the synchronization signal CLKIO. Because the slave PWM generator 104 operates based on the synchronization signal CLKIO, which is generated by the master PWM generator 102, the slave PWM generator 104 does not include an oscillator in the illustrated example of FIG. 1. Given the internal oscillator 106, the master PWM generator 102 has the capability to operate on its own to produce PWM signals without any slave devices.

As described in greater detail below, each of the PWM generators described herein generate two ramp signals, portions of which interact to create a virtual ramp (e.g., the virtual ramp highlighted in FIG. 5). As shown in FIG. 1, the ramp generator 112 of the master PWM generator 102 generates a falling ramp signal RAMPf and a rising ramp signal RAMPr. The ramp generator 122 of the slave PWM generator 104 generates similar falling and rising ramp signals RAMPf and RAMPr, respectively. Briefly, the virtual ramp is the result of coordinated charging and discharging of multiple capacitors (e.g., the capacitors 306 and 310 of FIG. 3), combined with control signals that dictate the behavior of the components of the PWM generators (e.g., the ramp generator 112 and/or the comparator module 114). To enable the interaction that produces the virtual ramp, the channel synchronizer 108 generates these control signals. Specifically, in the illustrated example of FIG. 1, the channel synchronizer 108 generates a rising reset signal RSTr, a falling reset signal RSTf, a rising comparator-enable signal GOr, and a falling comparator-enable signal GOf. The manner in which these signals are utilized is described in greater detail below in connection with FIGS. 3-4.

The channel synchronizer 108 also conveys data related to the control signals (e.g., the rising reset signal RSTr, the falling reset signal RSTf, the rising comparator-enable signal GOr, and the falling comparator-enable signal RSTf) over the synchronization interface 116 (e.g., in connection with or as part of the synchronization signal CLKIO). The channel synchronizer 118 of the slave PWM generator 104 receives the data via the synchronization interface 116, interprets the data, and constructs control signals corresponding to those of the master PWM generator 102. Specifically, in the illustrated example, the channel synchronizer 118 generates a rising reset signal S1_RSTr, a falling reset signal S1_RSTf, a rising comparator-enable signal S1_GOr, and a falling comparator-enable signal S1_GOf. These control signals provide a similar control over the components of the slave PWM generator 104 (e.g., the ramp generator 122 and/or the comparator module 124) as the corresponding control signals of the master PWM generator 102 (e.g., the ramp generator 112 and/or the comparator module 114). However, for purposes of clarity, only the operation of the control signals of the master PWM generator 102 are described herein in detail.

Figure 2:
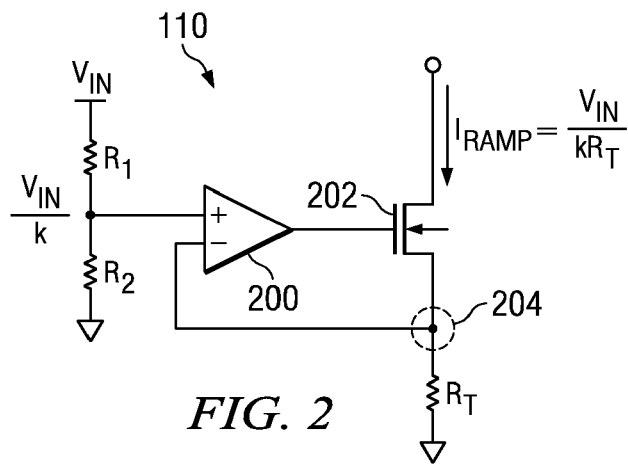
FIG. 2 illustrates an example implementation of the example current generators of FIG. 1.

FIG. 2 illustrates an example implementation of the example current generator 110 of FIG. 1. The current generator 120 of the slave PWM generator 104, the operation of which is omitted from this description for purposes of clarity, operates in a substantially similar manner as the current generator 110 of the master PWM generator 102. Generally, the current generator 110 produces a charge/discharge current $I_{RAMP}$ that is conveyed to and utilized by the oscillator 106 and the ramp generator 112. For example, the charge/discharge current $I_{RAMP}$ is used to set the frequency of the PWM signal 126 (e.g., via the oscillator 106) and to provide a feedforward path for the input voltage $V_{IN}$. Specifically, a resistor $R_T$, which may be an external resistor, enables a user to select the frequency of the oscillation of the falling and rising ramp signals RAMPf and RAMPr. Because the falling and rising ramp signals RAMPf and RAMPr interact to create the virtual ramp, the resistor $R_T$ effectively enables the user to select the frequency of the oscillation of the virtual ramp.

As shown in FIG. 2, the input voltage $V_{IN}$ is divided by a resistive voltage divider comprising two resistors $R_1$ and $R_2$, coupled in series between $V_{IN}$ and ground, with k (a factoring constant) being determined by the ratio of the resistors. The common connection node of resistors $R_1$ and $R_2$ is coupled to the non-inverting input of an operational amplifier 200. The output of the operational amplifier 200 is coupled to the gate of an NMOS transistor 202. The source of the transistor 202 is connected to one port of the resistor $R_T$, the other port of the resistor $R_T$ being coupled to ground. The operational amplifier 200 and the transistor 202 are connected in a unity gain configuration (e.g., the source of transistor 202 is coupled to the inverting input of the operational amplifier 200). This forces the voltage at node 204 to be equal to the input voltage $V_{IN}$ divided by the factoring constant k. Thus, in the illustrated example of FIG. 2, the current generator 110 buffers the input voltage $V_{IN}$ (divided by the factoring constant k) across the resistor $R_T$ to generate the charge/discharge current $I_{RAMP}$. As shown in FIG. 2, $I_{RAMP}=V_{IN}/kR_T$, thus providing a feedforward path for $V_{IN}$, which enables either voltage-mode control or current-mode control to be employed in the PWM topology.

Figure 3:
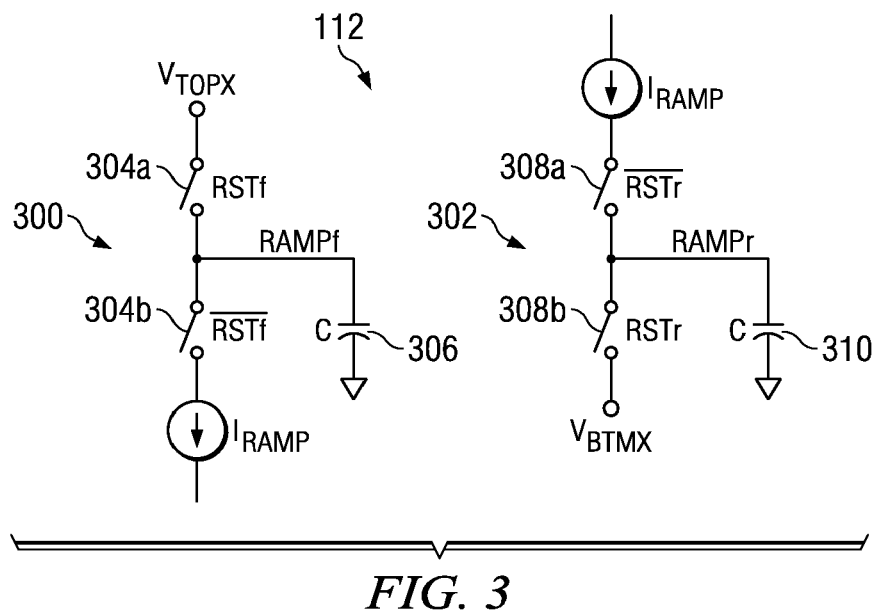
FIG. 3 illustrates an example implementation of the example ramp generator of FIG. 1, including falling and rising ramp generators.

FIG. 3 illustrates an example implementation of the example ramp generator 112 of FIG. 1. The ramp generator 122 of the slave PWM generator 104, the operation of which is omitted from this description for purposes of clarity, operates in a substantially similar manner as the ramp generator 112 of the master PWM generator 102. As described above, the ramp generator 112 receives the charge/discharge current $I_{RAMP}$ from the current generator 110, the falling and rising reset signals RSTf and RSTr from the channel synchronizer 108, and the boundary voltages $V_{TOP}$ and $V_{BTM}$ from the controller 130a. In the illustrated example, FIG. 3 shows a first circuit 300 to generate the falling ramp signal RAMPf separately from FIG. 3, which illustrates a second circuit 302 to generate the rising ramp signal RAMPr. However, in some examples, the first and second circuits 300 and 302 may be implemented together or integrated in any suitable manner.

The first circuit 300 includes two switches 304a and 304b, which are controlled by the falling reset signal RSTf. Because the second switch 304b is controlled by the inverted logic signal of RSTf, the two switches 304a and 304b are never on at the same time. In particular, the falling reset signal RSTf causes the switches 304a and 304b to couple a capacitor 306 to either a reset voltage $V_{TOPX}$ (to charge the capacitor 306) or to the charge/discharge current $I_{RAMP}$ (to discharge the capacitor 306). The value of the reset voltage $V_{TOPX}$ is calculated from the boundary voltage $V_{TOP}$ and is described in greater detail below.

Figure 6:
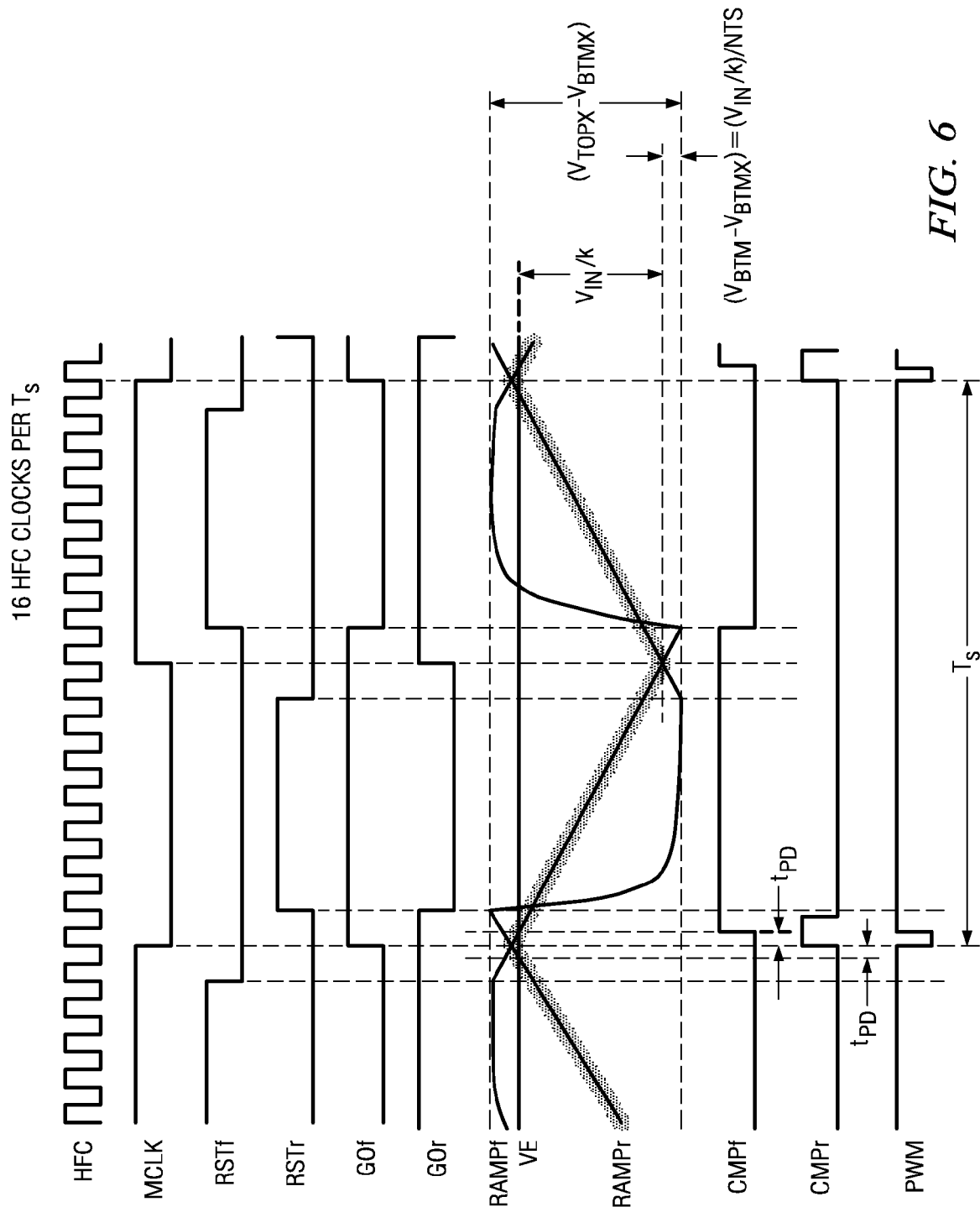
FIG. 6 is a group of plots showing a plurality of signals of the PWM system of FIG. 1 vertically aligned to show relative timing and configured for near 100% duty cycle.
Figure 7:
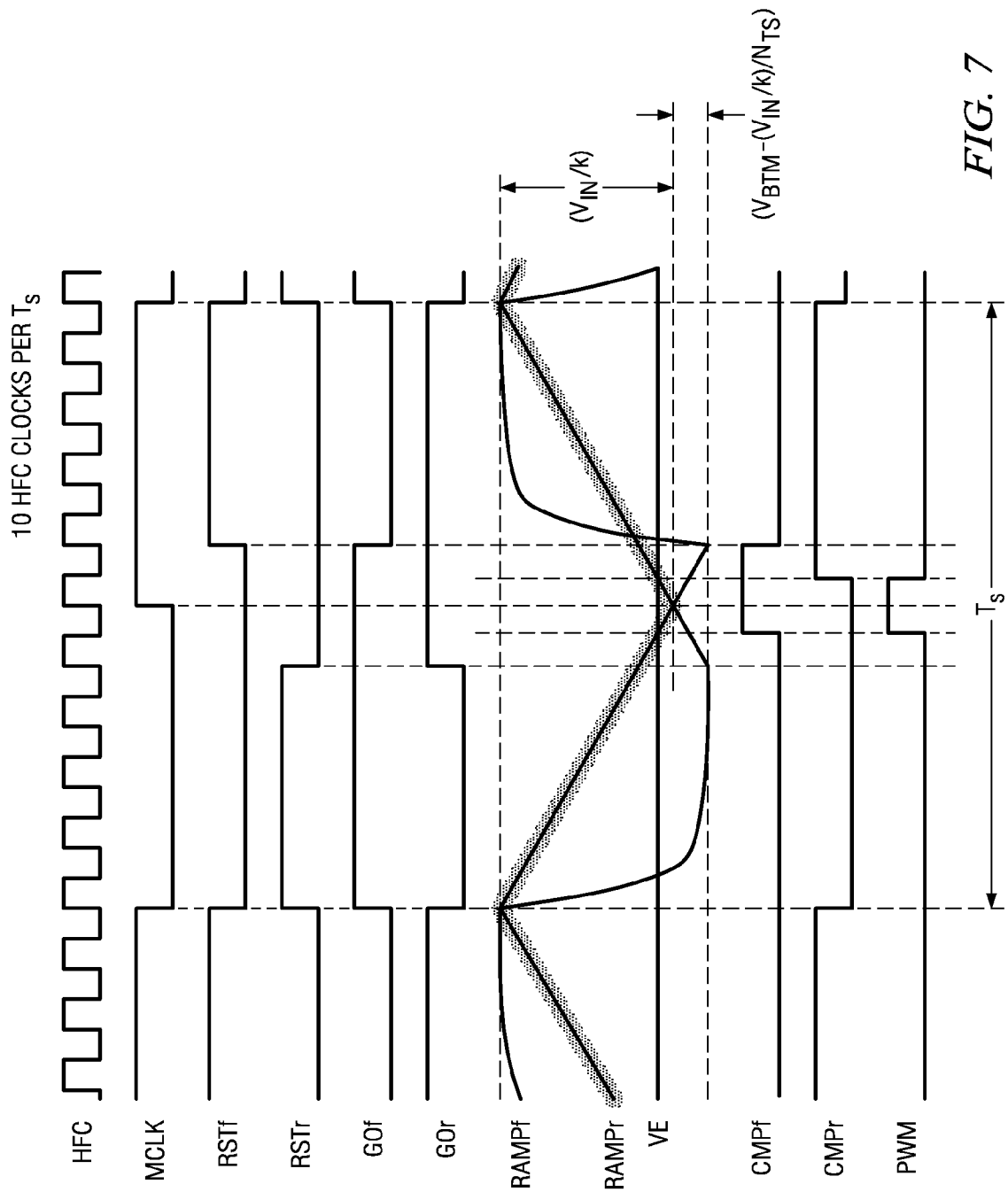
FIG. 7 is a group of plots showing a plurality of signals of the PWM system of FIG. 1 vertically aligned to show relative timing and configured for less than 100% duty cycle.

The second circuit 302 includes two switches 308a and 308b, which are controlled by the rising signal RSTr. Because the second switch 308b is controlled by the inverted logic signal of RSTr, the two switches 308a and 308b are never on at the same time. In particular, the rising reset signal RSTr causes the switches 308a and 308b to couple a capacitor 310 to either a reset voltage $V_{BTMX}$ or to the charge/discharge current $I_{RAMP}$ (to charge the capacitor 310). The value of the reset voltage $V_{BTMX}$ is calculated from the boundary voltage $V_{BTM}$ and is described in greater detail below. Thus, the circuits 300 and 302 of FIG. 3 produce the rising ramp signal RAMPr and the falling ramp signal RAMPf, which are conveyed to the comparator module 114. The relationship between the falling and rising reset signals RSTf and RSTr and the resulting falling and rising ramp signals RAMPf and RAMPr is illustrated in FIGS. 5-7. Specifically, the periodicity of the falling and rising reset signals RSTf and RSTr are set such that the falling ramp signal RAMPf and the rising ramp signal RAMPr intersect at the boundary voltages $V_{TOP}$ and $V_{BTM}$. The difference between the boundary voltages $V_{TOP}$ and $V_{BTM}$ sets the amplitude of the virtual ramp. In the illustrated example, the amplitude is equal to $V_{IN}/k$, according to the current generator 110 and the charge/discharge current $I_{RAMP}$ (e.g., as dictated by the feedforward path for $V_{IN}$ described above).

To provide a large amplitude for the virtual ramp and to enable larger comparator overdrives, the reset voltages $V_{TOPX}$ and $V_{BTMX}$ extend beyond the boundary voltages $V_{TOP}$ and $V_{BTM}$, allowing the falling and rising ramp signals RAMPf and RAMPr to continue charging/discharging (as described below in connection with FIG. 5). This reduces the jitter and noise experienced at extreme points of controllable duty cycle (e.g., near 0% and/or near 100%). To maintain the intersection points of the falling and rising ramp signals RAMPf and RAMPr, $V_{BTMX}$ and $V_{TOPX}$ are set as follows:

$$V_{BTMX}=V_{BTM}-((V_{IN}/k)(1/NTS)), \quad \text{[Equation 1]}$$

$$V_{TOPX}=V_{TOP}+((V_{IN}/k)(1/NTS)), \quad \text{[Equation 2]}$$

where NTS is the number of time slots per period $T_s$.

Figure 5:
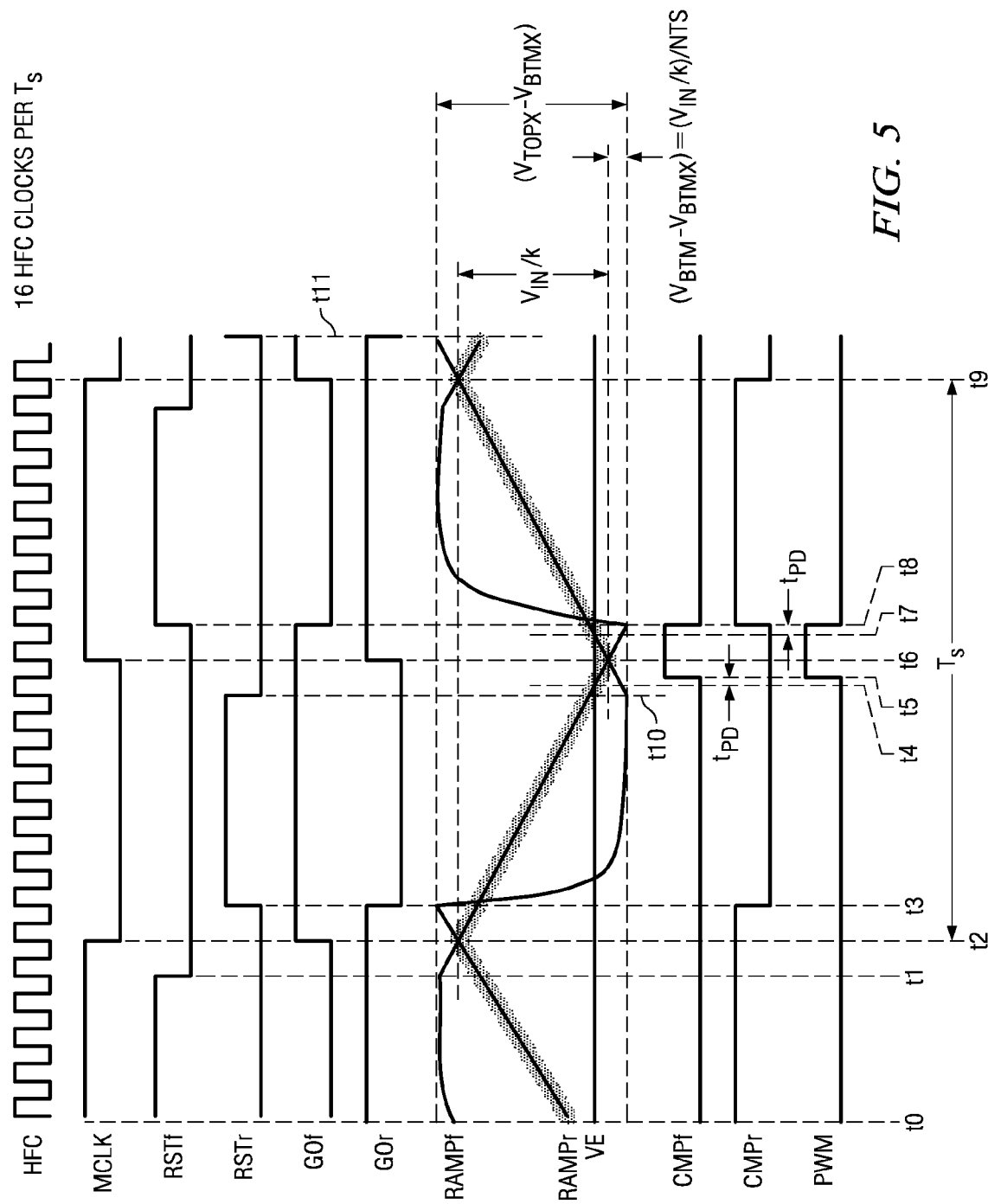
FIG. 5 is a group of plots showing a plurality of signals of the PWM system of FIG. 1 vertically aligned to show relative timing and configured for near 0% duty cycle.

The boundary voltages $V_{TOP}$ and $V_{BTM}$ are referred to as boundary voltages because they are the points that bound the falling and rising ramp signals RAMPf and RAMPr to create the virtual ramp described above (e.g., the virtual ramp highlighted in FIG. 5). In other words, the amplitude of the virtual ramp is equal to $(V_{TOP}-V_{BTM})$. In the illustrated example, $(V_{TOP}-V_{BTM})$ is set to be equivalent to $V_{IN}/k$. Further, using this value for the amplitude of the virtual ramp, the period $T_S$ of the PWM signal 126 can be defined by the following equation:

$$\frac{1}{T_S} = \frac{I_{RAMP}}{\frac{CV_{IN}}{k}}, \quad \text{[Equation 3]}$$

where C corresponds to the capacitance of the capacitors 306 and 310. Combining Equation 3 with the equation for $I_{RAMP}$ ($I_{RAMP}=V_{IN}/kR_T$) gives the following result for the frequency of the PWM signal 126, fs, $$f_S = \frac{1}{T_S} = \frac{1}{R_T C}, \quad \text{[Equation 4]}$$

which illustrates that the frequency of the PWM signal 126 is independent of $V_{IN}$. Thus, the frequency can be set with the resistor $R_T$ of FIG. 2.

Figure 4:
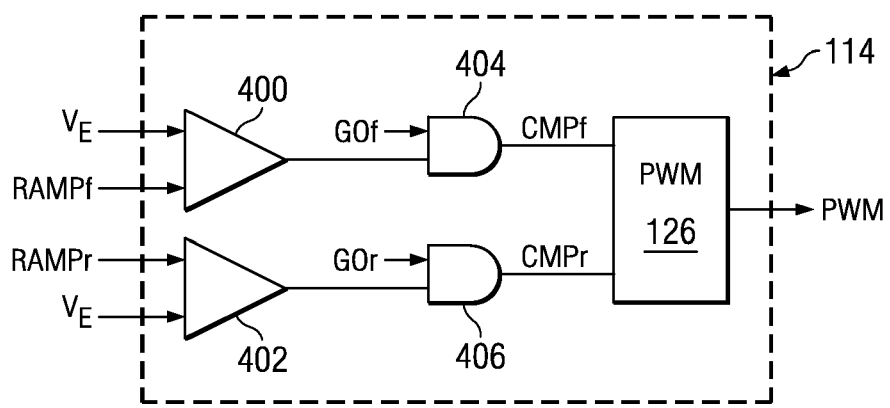
FIG. 4 illustrates an example implementation of the example comparator module of FIG. 1.

FIG. 4 illustrates an example implementation of the example comparator module 114 of FIG. 1. The comparator module 124 of the slave PWM generator 104, the operation of which is omitted from this description for purposes of clarity, operates in a substantially similar manner as the comparator module 114 of the master PWM generator 102. As described above, the comparator module 114 receives the falling and rising ramp signals RAMPf and RAMPr from the ramp generator 112, the falling and rising comparator-enable signals GOf and GOr from the channel synchronizer 108, and the error signal $V_E$ from the controller 130a. The example comparator module 114 illustrated in FIG. 4 includes a falling edge comparator 400, a rising edge comparator 402, a falling edge AND gate 404, and a rising edge AND gate 406. As described below, these components interact to produce a PWM set signal CMPf and a PWM reset signal CMPr.

The logic illustrated in the example comparator module 114 of FIG. 4 creates the PWM signal 126 of FIG. 1 by first comparing the falling and rising ramp signals RAMPf and RAMPr with the error signal $V_E$ and then checking if the corresponding comparator-enable signal (GOf or GOr) indicates that the result of the comparison can affect the PWM signal 126. Specifically, when the falling ramp signal RAMPf falls below the error signal $V_E$ (e.g., as determined by the falling edge comparator 400) while GOf is high, the falling edge AND gate 404 causes the PWM set signal CMPf to go high. When the rising ramp signal RAMPr rises above the error signal $V_E$ while GOr is high (e.g., as determined by the rising edge comparator 402), the rising edge AND gate 406 causes the PWM reset signal CMPr to go high. As can be seen in FIGS. 5-7, if the PWM set signal CMPf goes high, the PWM signal 126 is set to a logic high. If the PWM reset signal CMPr goes high, the PWM signal 126 is set to a logic low. These set/reset signals act on the PWM signal 126 to alter its state accordingly.

While an example manner of implementing the PWM system 100 of FIG. 1 has been illustrated in FIGS. 1-4, one or more of the elements, processes and/or devices illustrated in FIGS. 1-4 may be combined, divided, re-arranged, omitted, eliminated and/or implemented in any other way. Further, the example oscillator 106, the example channel synchronizer 108, the example current generator 110, the example ramp generator 112, the example comparator module 114, and/or, more generally, the example master PWM generator 102 of FIG. 1 may be implemented by hardware, software, firmware and/or any combination of hardware, software and/or firmware. Further, the example channel synchronizer 118, the example current generator 120, the example ramp generator 122, and the example comparator module 124, and/or, more generally, the example slave PWM generator 104 of FIG. 1 may be implemented by hardware, software, firmware and/or any combination of hardware, software and/or firmware. Further, the example controllers 130a and/or 130b of FIG. 1 may be implemented by hardware, software, firmware and/or any combination of hardware, software and/or firmware. Further, the comparators 400 and/or 402, and/or the AND gates 404 and/or 406 of FIG. 4 may be implemented by hardware, software, firmware and/or any combination of hardware, software and/or firmware.

Thus, for example, any of the example oscillator 106, the example channel synchronizer 108, the example current generator 110, the example ramp generator 112, the example comparator module 114, and/or, more generally, the example master PWM generator 102 of FIG. 1; the example channel synchronizer 118, the example current generator 120, the example ramp generator 122, and the example comparator module 124, and/or, more generally, the example slave PWM generator 104 of FIG. 1; the example controllers 130a and/or 130b of FIG. 1; and/or the comparators 400 and/or 402, and/or the AND gates 404 and/or 406 of FIG. 4, could be implemented by one or more circuit(s), programmable processor(s), application specific integrated circuit(s) (ASIC(s)), programmable logic device(s) (PLD(s)), and/or field programmable logic device(s) (FPLD(s)), etc.

FIGS. 5-7 are groups of graphs showing a plurality of signals of the PWM system of FIG. 1 vertically aligned to show relative timing. In each of FIGS. 5-7, the virtual ramp that is created by the PWM system 100 is highlighted. As described above, the falling and rising ramp signals RAMPf and RAMPr are compared with the error signal $V_E$. As shown by the highlighted virtual ramp, at certain times the virtual ramp comprises the falling ramp signal RAMPf and at other times the virtual ramp comprises the rising ramp signal RAMPr. The main clock MCLK indicates when the virtual ramp is rising and when it is falling. Referring to FIG. 5, between time t0 and t2, the virtual ramp comprises the rising ramp signal RAMPr (MCLK is high). Between time t2 and t6, the virtual ramp comprises the falling ramp signal RAMPf (MCLK is low). Between time t6 and t9, the virtual ramp comprises the rising ramp signal RAMPr.

FIG. 5 corresponds to a configuration of the PWM system 100 of FIG. 1 to enable a full range (0% to 100%) of controllable duty cycle. In particular, the falling and rising ramp signals RAMPf and RAMPr intersect and continue to charge/discharge beyond the switching points of the virtual ramp. This technique allows a larger comparator overdrive to be utilized at very high or low duty cycles. The example of FIG. 5 shows the PWM system 100 of FIG. 1 near 0% duty cycle (as indicated by the low position of the error signal VE). Further, as described in detail below, propagation delays typically associated with the comparators of PWM systems are cancelled out by the dual comparators (e.g., the comparators 400 and 402 of FIG. 4) described herein. In particular, the propagation delay on the falling side is equal to the propagation delay on the rising side, thereby cancelling each other out. This technique restricts the propagation delays from influencing the operation of the PWM system 100 (e.g., the periodicity of the signals) and improves repeatability between stacked integrated circuits (e.g., the master PWM generator 102 and the slave PWM generator 104 of FIG. 1).

As shown in FIG. 5, the PWM system 100 and, more specifically, the high frequency clock HFC are configured for eight (8) time slots per period NTS. As described above, the falling and rising ramp signals RAMPf and RAMPr rise and descend according to the falling and rising reset signals RSTf and RSTr. For example, at time t1, the falling reset signal RSTf goes low and, in response, the falling ramp signal RAMPf begins to descend. The falling ramp signal RAMPf continues to descend until the falling reset signal RSTf goes high again (around time t8). Further, at time t10, the rising ramp signal RAMPr rises (RSTr is low) until time t11, when RSTr goes high and the rising ramp signal RAMPr begins to descend. Both ramp signals RAMPf and RAMPr are driven to their respective reset voltages during their respective reset periods designated by RSTf and RSTr, respectively, being high.

As described above, the PWM set signal CMPf is high when the falling ramp signal RAMPf falls below the error signal $V_E$ and the falling comparator-enable signal GOf is high. In the illustrated example of FIG. 5, the falling ramp signal RAMPf drops below the error signal $V_E$ at time t4, at which time the falling comparator-enable signal GOf is high. Thus, the PWM set signal CMPf is set to high. However, as shown in FIG. 5, the associated comparator experiences a propagation delay $t_{PD}$, which causes the PWM set signal CMPf to actually go high at time t5. In other words, there is the propagation delay $t_{PD}$ equal to the difference between t5 and t4. As described above, because the PWM set signal CMPf goes high at time t5, the PWM signal 126 goes high at time t5.

In a similar manner, the PWM reset signal CMPr is high when the rising ramp signal RAMPr rises above the error signal $V_E$ and the rising comparator-enable signal GOf is high. In the illustrated example of FIG. 5, the rising ramp signal RAMPr rises above the error signal $V_E$ at time t7, at which time the rising comparator-enable signal GOr is high. Thus, the PWM reset signal CMPr is set to high. However, as shown in FIG. 5, the associated comparator experiences a propagation delay $t_{PD}$, which causes the PWM reset signal CMPr to actually go high at time t8. In other words, there is the propagation delay $t_{PD}$ equal to the difference between t8 and t7. As described above, because the PWM reset signal CMPr goes high at time t8, the PWM signal 126 goes low at time t8. Thus, the behavior of the falling and rising ramp signals RAMPf and RAMPr, combined with the assignment of which ramp signal comprises the virtual ramp (according to the main clock MCLK), is utilized to generate the PWM signal 126.

FIG. 6 corresponds to a configuration of the PWM system 100 of FIG. 1 to enable a full range (0% to 100%) of controllable duty cycle. More specifically, the example of FIG. 6 shows the PWM system 100 of FIG. 1 near 100% duty cycle (as indicated by the high position of the error signal $V_E$). The example of FIG. 6 operates similar to the example of FIG. 5.

FIG. 7 corresponds to a configuration of the PWM system 100 of FIG. 1 intended for a PWM of less than 100% duty cycle. The example of FIG. 7 operates similar to the example of FIG. 5. However, because a full range of controllable duty cycle is not desired, there is no need to generate $V_{TOPX}$. Further, instead of 8 time slots per period NTS as shown in FIGS. 5 and 6, the example of FIG. 7 is configured for 5 time slots per period NTS.

Although certain example methods, apparatus and articles of manufacture are described herein, other implementations are possible. The scope of coverage of this patent is not limited to the specific examples described herein. On the contrary, this patent covers all apparatus, methods, and articles of manufacture falling within the scope of the invention.

What is claimed is:

1. A pulse width modulation generator, comprising:
   a ramp generator to generate first and second ramp signals that interact to form a virtual ramp signal; and
   a comparator module coupled to the ramp generator configured to produce a pulse width modulated signal based on a comparison between the virtual ramp signal and an input signal.

2. A pulse width modulation generator as defined in claim 1, further comprising a current generator to generate a current to drive the first and second ramp signals.

3. A pulse width modulation generator as defined in claim 2, wherein the current generator includes a feedforward path to enable a voltage-control mode and a current-control mode.

4. A pulse width modulation generator as defined in claim 1, further comprising an oscillator to set a periodicity of the pulse width modulation generator and a frequency of the pulse width modulated signal.

5. A pulse width modulation generator as defined in claim 1, further comprising a synchronization interface to enable a communication with one or more other pulse width modulation generators.

6. A pulse width modulation generator as defined in claim 5, wherein the pulse width modulation generator is configured as a master and the one or more other pulse width modulation generators are configured as one or more slaves.

7. A pulse width modulation generator as defined in claim 1, wherein the pulse width modulated signal can be modulated in a range of zero percent to one hundred percent.

8. A pulse width modulation generator as defined in claim 1, further comprising a synchronizer to generate control signals that enable the comparator module.

9. A pulse width modulation generator as defined in claim 1, further comprising a synchronizer to generate control signals that produce the first and second ramp signals.

10. A pulse width modulation generator as defined in claim 1, further comprising boundary signals to define an amplitude of the virtual ramp.

11. A pulse width modulation generator as defined in claim 10, wherein the first and second ramp signals extend beyond first and second levels defined by the boundary signals.

12. A method for use in a pulse width modulation system, comprising:
    generating first and second ramp signals that interact to form a virtual ramp signal; and
    comparing the virtual ramp signal to an input signal to produce a pulse width modulated signal.

13. A method as defined in claim 12, further comprising synchronizing a master pulse width modulation generator with a slave pulse width modulation generator.

14. A method as defined in claim 12, wherein the pulse width modulated signal can be modulated in a range of zero percent to one hundred percent.

15. A method as defined in claim 12, further comprising defining first and second boundary levels to define an amplitude of the virtual ramp.

16. A method as defined in claim 12, further comprising providing a feedforward path for a voltage input to enable a voltage-control mode and a current-control mode.

17. A method as defined in claim 12, further comprising providing an external resistor capable of controlling the frequency of the pulse width modulated signal.

18. A pulse width modulation system, comprising:
    a master pulse width modulation generator comprising a first ramp generator to generate first and second ramp signals that interact to form a first virtual ramp signal, and a first comparator module configured to produce a first pulse width modulated signal based on a first comparison between the first virtual ramp signal and a first input signal;
    a slave pulse width modulation generator comprising a second ramp generator to generate third and fourth ramp signals that interact to form a second virtual ramp signal, and a second comparator module configured to produce a second pulse width modulated signal based on a second comparison between the second virtual ramp signal and a second input signal.

19. A pulse width modulation system as defined in claim 18, further comprising a synchronization interface placing the master pulse width generator in communication with the slave pulse width modulation generator.

20. A pulse width modulation system as defined in claim 19, the master pulse width modulation generator further comprising a synchronizer to generate a synchronization signal that is conveyed over the synchronization interface.

21. A pulse width modulation generator, comprising:
    a ramp generator to generate first and second ramp signals;
    a controller to generate an error signal and a voltage, wherein the voltage defines an amplitude of the first and second ramp signals;
    a signal to select one of the first and second ramp signals for a comparison with the error signal, wherein the signal is configured to select another one of the first and second ramp signals for the comparison with the error signal before the one of the first and second ramp signals reaches the amplitude.

22. A pulse width modulation generator as defined in claim 21, further comprising first and second reset signals to control a charging and discharging of the first and second ramp signals.

23. A pulse width modulation generator as defined in claim 21, further comprising first and second enable signals to define a period during which the comparison with the error signal can affect an output of the pulse width modulation generator.

* * * * *